United States Patent
Asano et al.

(10) Patent No.: US 7,692,272 B2
(45) Date of Patent: Apr. 6, 2010

(54) ELECTRICALLY REWRITABLE NON-VOLATILE MEMORY ELEMENT AND METHOD OF MANUFACTURING THE SAME

(75) Inventors: Isamu Asano, Tokyo (JP); Natsuki Sato, Tokyo (JP); Wolodymyr Czubatyj, Rochester Hills, MI (US); Jeffrey P. Fournier, Rochester Hills, MI (US)

(73) Assignee: Elpida Memory, Inc., Tokyo (JP)

( * ) Notice: Subject to any disclaimer, the term of this patent is extended or adjusted under 35 U.S.C. 154(b) by 488 days.

(21) Appl. No.: 11/334,504

(22) Filed: Jan. 19, 2006

(65) Prior Publication Data

US 2007/0164267 A1    Jul. 19, 2007

(51) Int. Cl.
 *H01L 31/0264* (2006.01)
(52) U.S. Cl. .............................. 257/613; 257/E31.029; 257/441
(58) Field of Classification Search ......... 257/613–619, 257/E31.029, E31.03, 188, 189, 441, 442
See application file for complete search history.

(56) References Cited

U.S. PATENT DOCUMENTS

| | | | |
|---|---|---|---|
| 6,075,719 | A | 6/2000 | Lowrey et al. |
| 6,586,761 | B2 | 7/2003 | Lowrey |
| 6,590,807 | B2 | 7/2003 | Lowrey |
| 6,791,107 | B2 | 9/2004 | Gill et al. |
| 6,795,338 | B2 | 9/2004 | Parkinson et al. |
| 6,859,390 | B2 | 2/2005 | Pashmakov |
| 6,862,214 | B2 | 3/2005 | Lee et al. |
| 7,190,048 | B2 * | 3/2007 | Campbell .................. 257/613 |
| 2004/0188735 | A1 | 9/2004 | Hideki |
| 2006/0012008 | A1 | 1/2006 | Campbell |

FOREIGN PATENT DOCUMENTS

| | | |
|---|---|---|
| CN | 1554125 A | 12/2004 |
| CN | 1588613 A | 3/2005 |
| CN | 101019191 A | 8/2007 |
| TW | 472256 | 1/2002 |
| TW | 1239528 | 9/2005 |

OTHER PUBLICATIONS

Yi, J., et al. "Novel Cell Structure of PRAM with thin metal layer inserted GeSbTe" IEEE, 2003.
Taiwanese Office Action issued in Taiwan Patent Application No. TW 095140389, dated Nov. 18, 2008.

(Continued)

*Primary Examiner*—Leonardo Andújar
(74) *Attorney, Agent, or Firm*—McDermott Will & Emery LLP

(57) ABSTRACT

A non-volatile memory element comprises a bottom electrode 12; a top electrode 15; and a recording layer 13 containing phase change material and a block layer 14 that can block phase change of the recording layer 13, provided between the bottom electrode 12 and the top electrode 15. The block layer 14 is constituted of material having an electrical resistance that is higher than that of material constituting the recording layer 13. The block layer 14 suppresses the radiation of heat towards the top electrode 15 and greatly limits the phase change region when a write current is applied. The result is a high heating efficiency. The top electrode 15 itself can be used to constitute a bit line, or a separate bit line can be provided.

17 Claims, 10 Drawing Sheets

OTHER PUBLICATIONS

Chinese Office Action, with English Translation, issued in Chinese Patent Application No. CN 2006-101684441 dated on Sep. 19, 2008.

Chinese Office Action, w/ English abstract thereof, issued in Chinese Patent Application No. CN 200610168444.1 dated Oct. 23, 2009.

* cited by examiner

ELECTRICALLY REWRITABLE NON-VOLATILE MEMORY ELEMENT AND METHOD OF MANUFACTURING THE SAME

TECHNICAL FIELD

The present invention relates to an electrically rewritable non-volatile memory element and to a method of manufacturing the element. More specifically, the present invention relates to an electrically rewritable non-volatile memory element having a recording layer that includes phase change material, and to a method of manufacturing the element.

BACKGROUND OF THE INVENTION

Personal computers and servers and the like use a hierarchy of memory devices. There is lower-tier memory, which is inexpensive and provides high storage capacity, while memory higher up the hierarchy provides high-speed operation. The bottom tier generally consists of magnetic storage such as hard disks and magnetic tape. In addition to being non-volatile, magnetic storage is an inexpensive way of storing much larger quantities of information than solid-state devices such as semiconductor memory. However, semiconductor memory is much faster and can access stored data randomly, in contrast to the sequential access operation of magnetic storage devices. For these reasons, magnetic storage is generally used to store programs and archival information and the like, and, when required, this information is transferred to main system memory devices higher up in the hierarchy.

Main memory generally uses dynamic random access memory (DRAM) devices, which operate at much higher speeds than magnetic storage and, on a per-bit basis, are cheaper than faster semiconductor memory devices such as static random access memory (SRAM) devices.

Occupying the very top tier of the memory hierarchy is the internal cache memory of the system microprocessor unit (MPU). The internal cache is extremely high-speed memory connected to the MPU core via internal bus lines. The cache memory has a very small capacity. In some cases, secondary and even tertiary cache memory devices are used between the internal cache and main memory.

DRAM is used for main memory because it offers a good balance between speed and bit cost. Moreover, there are now some semiconductor memory devices that have a large capacity. In recent years, memory chips have been developed with capacities that exceed one gigabyte. DRAM is volatile memory that loses stored data if its power supply is turned off. That makes DRAM unsuitable for the storage of programs and archival information. Also, even when the power supply is turned on, the device has to periodically perform refresh operations in order to retain stored data, so there are limits as to how much device electrical power consumption can be reduced, while yet a further problem is the complexity of the controls run under the controller.

Semiconductor flash memory is high capacity and non-volatile, but requires high current for writing and erasing data, and write and erase times are slow. These drawbacks make flash memory an unsuitable candidate for replacing DRAM in main memory applications. There are other non-volatile memory devices, such as magnetoresistive random access memory (MRAM) and ferroelectric random access memory (FRAM), but they cannot easily achieve the kind of storage capacities that are possible with DRAM.

Another type of semiconductor memory that is being looked to as a possible substitute for DRAM is phase change random access memory (PRAM), which uses phase change material to store data. In a PRAM device, the storage of data is based on the phase state of phase change material contained in the recording layer. Specifically, there is a big difference between the electrical resistivity of the material in the crystalline state and the electrical resistivity in the amorphous state, and that difference can be utilized to store data.

This phase change is effected by the phase change material being heated when a write current is applied. Data is read by applying a read current to the material and measuring the resistance. The read current is set at a level that is low enough not to cause a phase change. Thus, the phase does not change unless it is heated to a high temperature, so data is retained even when the power supply is switched off.

For the write current to efficiently heat the phase change material, preferably the structure used should be one that does not readily allow the heat generated by the write current to diffuse. For this, "Novel cell structure of PRAM with thin metal layer inserted GeSbTe", J. H. Yi, Y. H. Ha, J. H. Park, B. J. Kuh, H. Horii, Y. T. Kim, S. O. Park, Y. N. Hwang, S. H. Lee, S. J. Ahn, S. Y. Lee, J. S. Hong, K. H. Lee, N. I. Lee, H. K. Kang, U-In Chung and J. T. Moon, 2003 IEEE proposes a structure in which the recording layer consists of two layers and titanium nitride (TiN) is provided between the layers.

However, titanium nitride has an electrical resistivity in the order of several tens to several hundred $\mu\Omega cm$, which is quite low compared to the several $m\Omega cm$ of $Ge_2Sb_2Te_5$, a phase change material in general use. This low resistance has been a problem, in that the joule heat generated by the current flowing through the upper and lower recording layers spreads out along the plane of the intermediate layer, so the heat radiates towards the upper recording layer.

US 2004/0188735 A1 describes a non-volatile memory element in which the object is to provide improved heating efficiency.

SUMMARY OF THE INVENTION

It is therefore an object of the present invention to provide an improved electrically rewritable non-volatile memory element having a recording layer that contains phase change material, and a method for manufacturing the memory element.

Another object of the invention is to provide an electrically rewritable non-volatile memory element with high heating efficiency having a recording layer that contains phase change material, and a method for manufacturing the memory element.

The above and other objects of the present invention can be accomplished by a non-volatile memory element comprising a bottom electrode; a top electrode; and a recording layer containing phase change material and a block layer that can block phase change of the recording layer, provided between the bottom electrode and the top electrode, wherein the block layer is constituted of material having an electrical resistance that is higher than that of material constituting the recording layer.

Thus, the non-volatile memory element of the present invention has a block layer that is constituted of a material that has a higher electrical resistance than that of the recording layer and can block phase change of the recording layer. The block layer suppresses the flow of heat towards the top electrode and greatly limits the phase change region when a write current is applied. The result is a high heating efficiency. In addition, the top electrode itself can be used to constitute a bit line, or a separate bit line can be provided.

The block layer can be constituted of phase change material that has a different composition from that of the phase change material of the recording layer. In such a case, it is preferable for the phase change material of the block layer to have a crystallization temperature that is higher than the crystallization temperature of the phase change material used for the recording layer. That prevents the block layer from undergoing a phase change during the crystallization of the recording layer, thereby enabling the amorphous state of the block layer to be maintained.

To prevent intermixing between the recording layer and the block layer, an intermediate layer can be provided between the recording layer and the block layer. Preferably, this intermediate layer is comprised of a material having a higher electrical resistance than the recording layer, which prevents the heating efficiency being reduced by the provision of the intermediate layer.

The above and other objects of the present invention can also be accomplished by a non-volatile memory element comprising a bottom electrode; a top electrode; and a first and a second phase change material layers provided in that order between the bottom electrode and the top electrode, wherein the phase change material constituting the second phase change material layer has a crystallization temperature that is higher than a crystallization temperature of the phase change material constituting the first phase change material layer.

In accordance with this, the first phase change material layer functions as a recording layer and the second phase change material layer functions as a block layer, making it possible to achieve high heating efficiency.

The above and other objects of the present invention can also be accomplished by a method of manufacturing a non-volatile memory element comprising a first step for forming a recording layer containing phase change material on a bottom electrode; a second step for forming, on the recording layer, a block layer constituted of material having an electrical resistance that is higher than that of material constituting the recording layer which can block phase change of the recording layer; and a third step for forming a top electrode on the block layer.

By thus providing a structure consisting of a block layer between the recording layer and the top electrode, a non-volatile memory element having high heating efficiency can be manufactured.

In this case too, it is preferable for the block layer to be constituted of phase change material having a composition that differs from that of the phase change material constituting the recording layer, and for the phase change material of the block layer to have a crystallization temperature that is higher than the maximum temperature used in the manufacturing process, since in that case the phase change material of the block layer maintains its amorphous state, making it easy to achieve an electrical resistance that is higher than that of the recording layer.

As described above, an electrically rewritable non-volatile memory element having improved heating efficiency, and a method of manufacturing the element can be provided. Therefore, not only a write current can be decreased but also a writing speed can be enhanced.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained in detail with reference to the drawings.

Figure 1:
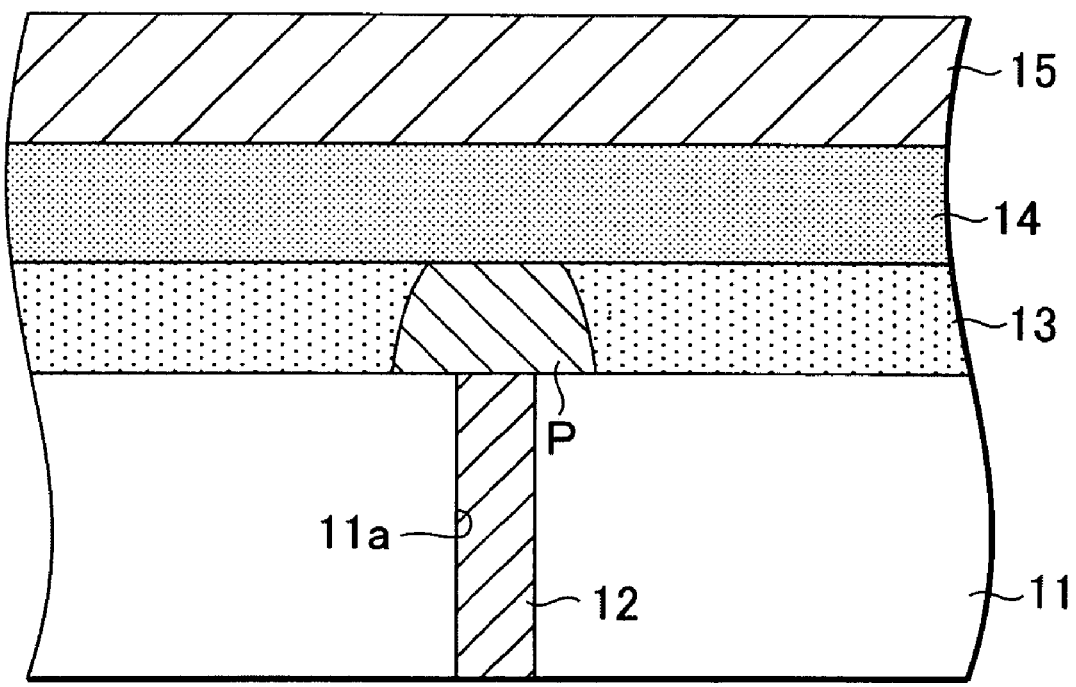
FIG. 1 is a cross-sectional view of the memory element according to a first embodiment of the present invention.

FIG. 1 is a cross-sectional view of the memory element according to a first embodiment of the present invention.

As shown in FIG. 1, the non-volatile memory element 10 according to this embodiment includes an interlayer isolation layer 11, a bottom electrode 12 buried within the interlayer isolation layer 11, and a recording layer 13, block layer 14 and top electrode 15 formed, in that order, on the interlayer isolation layer 11. In this embodiment, the top electrode 15 is also used as a bit line.

The interlayer isolation layer 11 can be formed of silicon oxide or silicon nitride or the like. The bottom electrode 12 is formed in a through-hole 11a formed in the interlayer isolation layer 11.

The bottom electrode 12 is used as a heater plug. That is, it constitutes part of the heater during data writes. For this, the bottom electrode 12 is preferably formed of a material having a relatively high electrical resistance, such as metal silicides, metal nitrides and nitrides of metal silicides. These include, but are not limited to, W, TiN, TaN, WN, TiAlN and other high-melting-point metals and nitrides thereof, or nitrides of high-melting-point metal silicides such as TiSiN and WSiN, as well as TiCN and other such materials.

The recording layer 13 is formed of phase change material. While the phase change material is not particularly limited and may be any material that takes two or more states and in which each state has a different electrical resistance, it is preferable to choose a chalcogenide material. Chalcogenide material means an alloy containing one or more elements such as germanium, antimony, tellurium, indium, and selenium. Examples include binary system alloys such as GaSb, InSb, InSe, $Sb_2Te_3$, and GeTe; ternary system alloys such as $Ge_2Sb_2Te_5$, InSbTe, GaSeTe, $SnSb_2Te_4$, and InSbGe; and quaternary system alloys such as AgInSbTe, (GeSn) SbTe, GeSb (SeTe), and $Te_{81}Ge_{15}Sb_2S_2$.

The phase change material containing the chalcogenide material can take an amorphous state or a crystalline state. In the amorphous state the resistance is relatively high, and in the crystalline state the resistance is relatively low.

Figure 2:
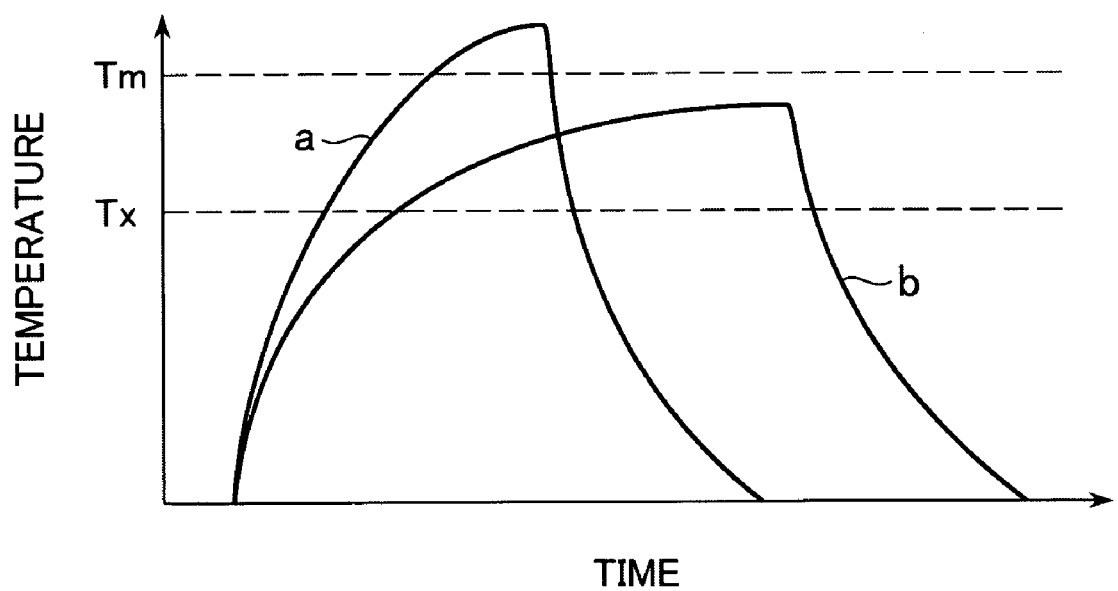
FIG. 2 is a graph for explaining the method of controlling the phase state of phase change material containing chalcogenide material.

FIG. 2 is a graph for explaining the method of controlling the phase state of phase change material containing chalcogenide material.

The phase change material is changed to the amorphous state by heating it to or above the melting temperature Tm and then cooling it, as shown by the curve a in FIG. 2. To change the material to the crystalline state, it is heated to a temperature that is at least as high as the crystallization temperature Tx and below the melting temperature Tm, as shown by curve b in FIG. 2. The heating temperature is controlled by controlling the duration and the amount of current per unit time that is passed through the material during the heating.

When a write current is applied to the recording layer 13, a portion of the recording layer 13 directly above the bottom electrode 12 heats up. Specifically, the phase state of chalcogenide material in the phase change region P shown in FIG. 1 can be switched by applying a write current to the recording layer 13. At this time, the presence of the block layer 14 above the recording layer 13 keeps the phase change region P confined inside the recording layer 13, since it is difficult for the region to extend into the block layer 14. Thus, the block layer 14 functions to block the phase change in itself, stopping the recording layer 13 from growing.

In order to reduce the amount of write current that has to be applied to the recording layer 13 to effect the change from the crystalline state to the amorphous, it is preferable to form the recording layer 13 of a material having a rather large electrical resistance of from several tens to several hundred μΩcm, for example. As described later herein, the electrical resistance can be adjusted by adjusting the amount of impurity, such as nitrogen and the like, added to the chalcogenide material. While there is no particular limitation on the thickness of the recording layer 13, a thickness of no more than 100 nm is preferable. Since in this embodiment there is the block layer 14 above the recording layer 13, the recording layer 13 can be made quite thin, in the order of 30 nm, for example.

The block layer 14 is constituted of a material having a higher electrical resistance than that of the recording layer 13, and in this embodiment is provided in contact with the recording layer 13. Also, the block layer 14 is formed of a phase change material having a different composition to that of the phase change material constituting the recording layer 13. As such, the recording layer 13 can be regarded as a first phase change material layer and the block layer 14 as a second phase change material layer.

While there is no particular limitation on the electrical resistance of the block layer 14, provided it is higher than the electrical resistance of the recording layer 13, a preferable resistance is one that is in the order of several Ωcm to several tens Ωcm. The block layer 14 can be around the same thickness as the recording layer 13, or thicker. In one example, the block layer 14 can be given a higher electrical resistance than that of the recording layer 13 by using the phase change material as that of the recording layer 13 and increasing the amount of nitrogen or other such impurity that is added. Alternatively, the block layer 14 can be constituted of a phase change material having a principal component that is different from that of the phase change material used to constitute the recording layer 13.

When the block layer 14 is constituted of phase change material, as in this embodiment, it is preferable to choose a phase change material with a crystallization temperature that is higher than that of the phase change material used to constitute the recording layer 13, since that will prevent the block layer 14 from being phase-changed when a write current is applied to the recording layer 13. If a much larger write current is used, the phase change region P could extend into the block layer 14. When the block layer 14 has a high crystallization temperature, however, it greatly suppresses the spread of the phase change region P into the block layer 14, even when a very high write current is applied.

Figure 3A:
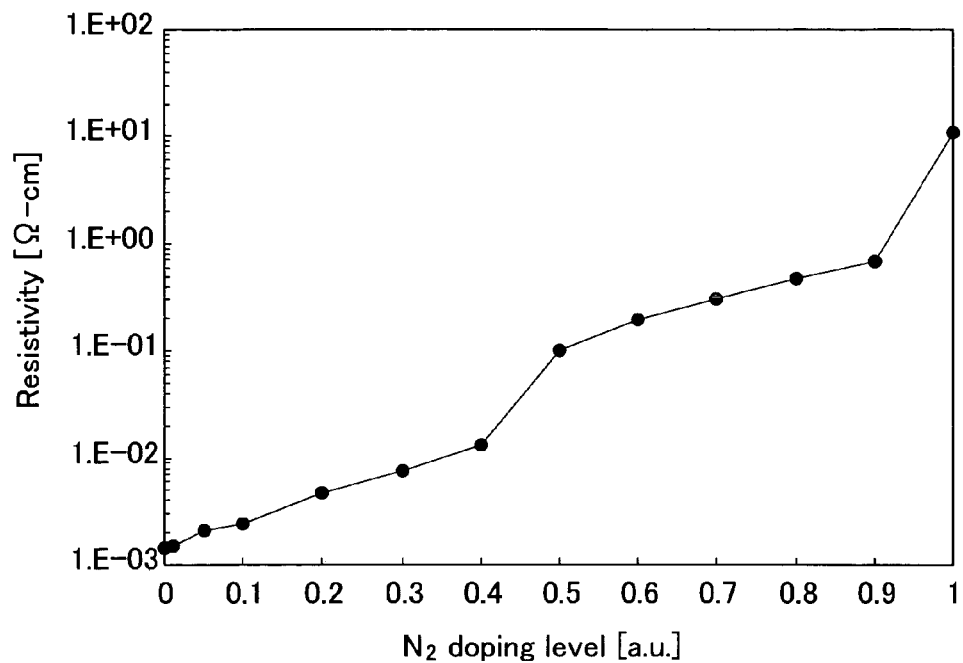
FIG. 3A is a graph showing the relationship between resistivity and the amount of nitrogen added to the phase change material $Ge_2Sb_2Te_5$.
Figure 3B:
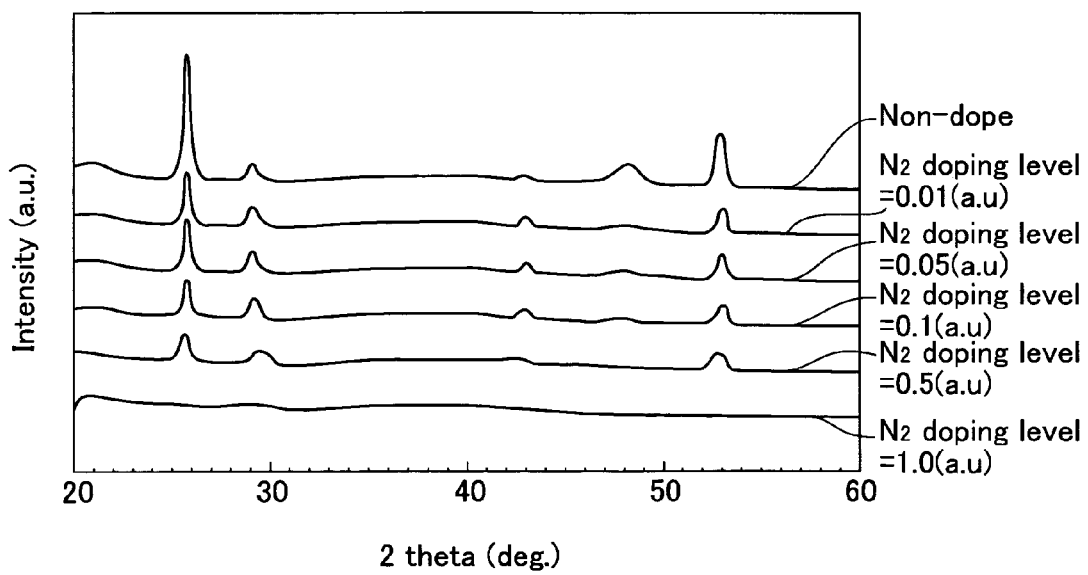
FIG. 3B is a graph showing the results of x-ray diffraction evaluation of the structure of $Ge_2Sb_2Te_5$ films to which different amounts of nitrogen have been added.

FIG. 3A is a graph showing the relationship between resistivity and the amount of nitrogen added to the phase change material $Ge_2Sb_2Te_5$ and FIG. 3B is a graph showing the results of x-ray diffraction evaluation of the structure of $Ge_2Sb_2Te_5$ films to which different amounts of nitrogen have been added, made at the completion of the memory element 10.

As shown in FIG. 3A, resistivity rises with the increase in the amount of nitrogen added to the $Ge_2Sb_2Te_5$. As shown in FIG. 3B, increasing the amount of added nitrogen causes a decrease in the x-ray peak signifying the crystalline state, showing that the ratio of material in the amorphous state is increasing. From FIG. 3B, it can be understood that increasing the amount of added nitrogen makes it more difficult for the heat applied during the manufacturing process to give rise to crystallization, so that a higher temperature is required to effect the crystallization. That is, increasing the amount of nitrogen added to the $Ge_2Sb_2Te_5$ raises the crystallization temperature.

The top electrode 15 also functions as a bit line, as described above, and in this embodiment is provided in contact with the block layer 14. For the top electrode 15, a metallic material is chosen that has low electrical resistance. Examples of suitable materials include aluminum (Al), titanium (Ti), and tungsten (W), as well as alloys, nitrides and silicides thereof. Specific examples that can be cited include W, WN, and TiN.

In general a metallic material with a low resistance has a high thermal conductivity, and since, moreover, the top electrode 15 has a large thermal capacity, close proximity between the phase change region P and the top electrode 15 will make it easy for heat to diffuse towards the top electrode 15, reducing the heating efficiency. However, because in the non-volatile memory element 10 of this embodiment the block layer 14, which has a high electrical resistance, is provided between the top electrode 15 and the recording layer 13, heat flowing towards the top electrode 15 is effectively decreased.

The non-volatile memory element 10 thus constituted can be formed on a semiconductor substrate in the form of a matrix to constitute an electrically rewritable non-volatile memory device.

Figure 4:
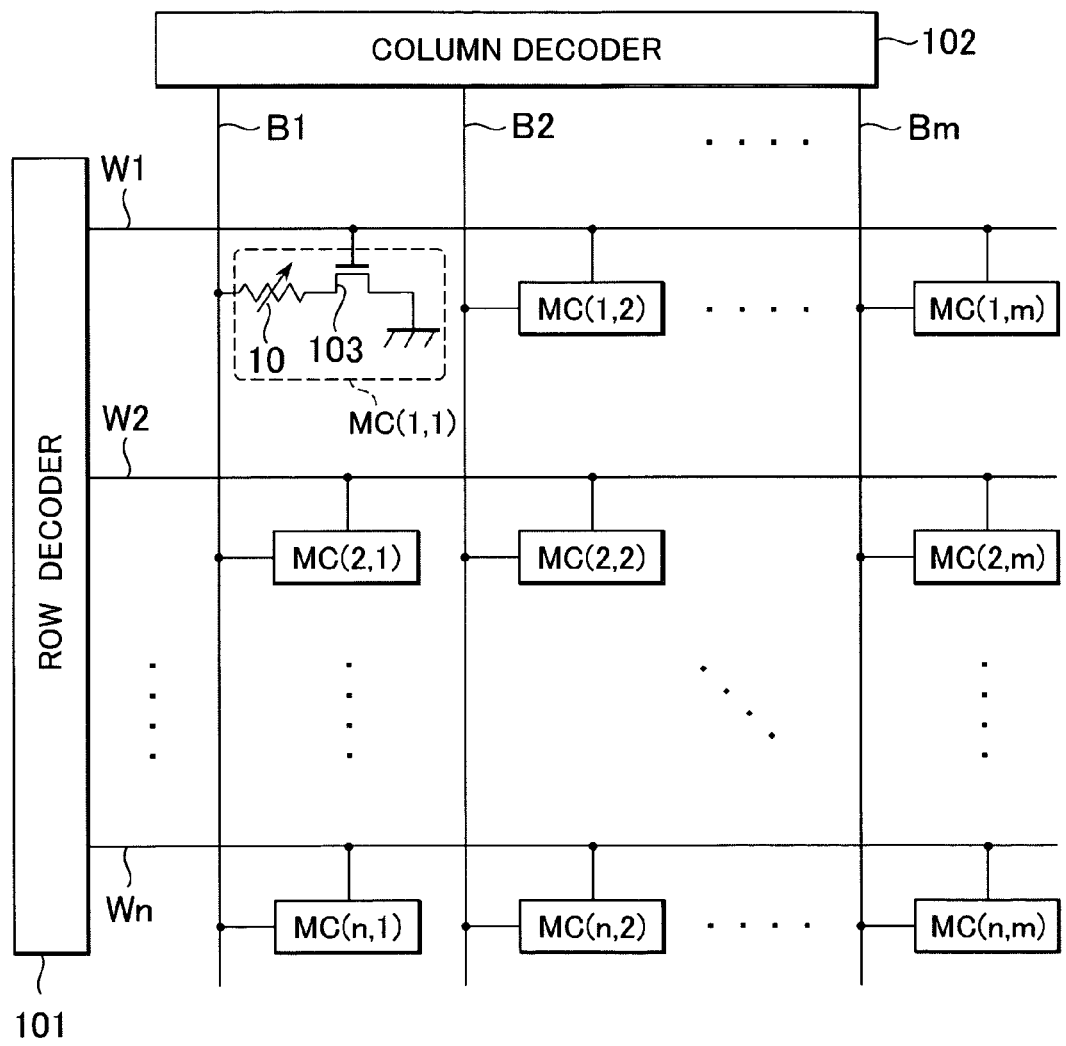
FIG. 4 is a circuit diagram of a non-volatile memory device configured as a matrix of n rows and m columns.

FIG. 4 is a circuit diagram of a non-volatile memory device configured as a matrix of n rows and m columns.

The non-volatile memory device shown in FIG. 4 has n word lines W1 to Wn, m bit lines B1 to Bm, and memory cells MC (1, 1) to MC (n, m), each located at an intersection of a word line and bit line. The word lines W1 to Wn are connected to a row decoder 101, and the bit lines B1 to Bm are connected to a column decoder 102. Each memory cell MC consists of a memory element 10 and transistor 103 connected in series between the corresponding bit line and ground. The control terminal of transistor 103 is connected to the corresponding word line.

The structure of the memory element 10 is as has been described with reference to FIG. 1. Thus, the bottom electrode 12 is connected to a corresponding transistor 103 and the top electrode 15 is used as the bit line.

Figure 5:
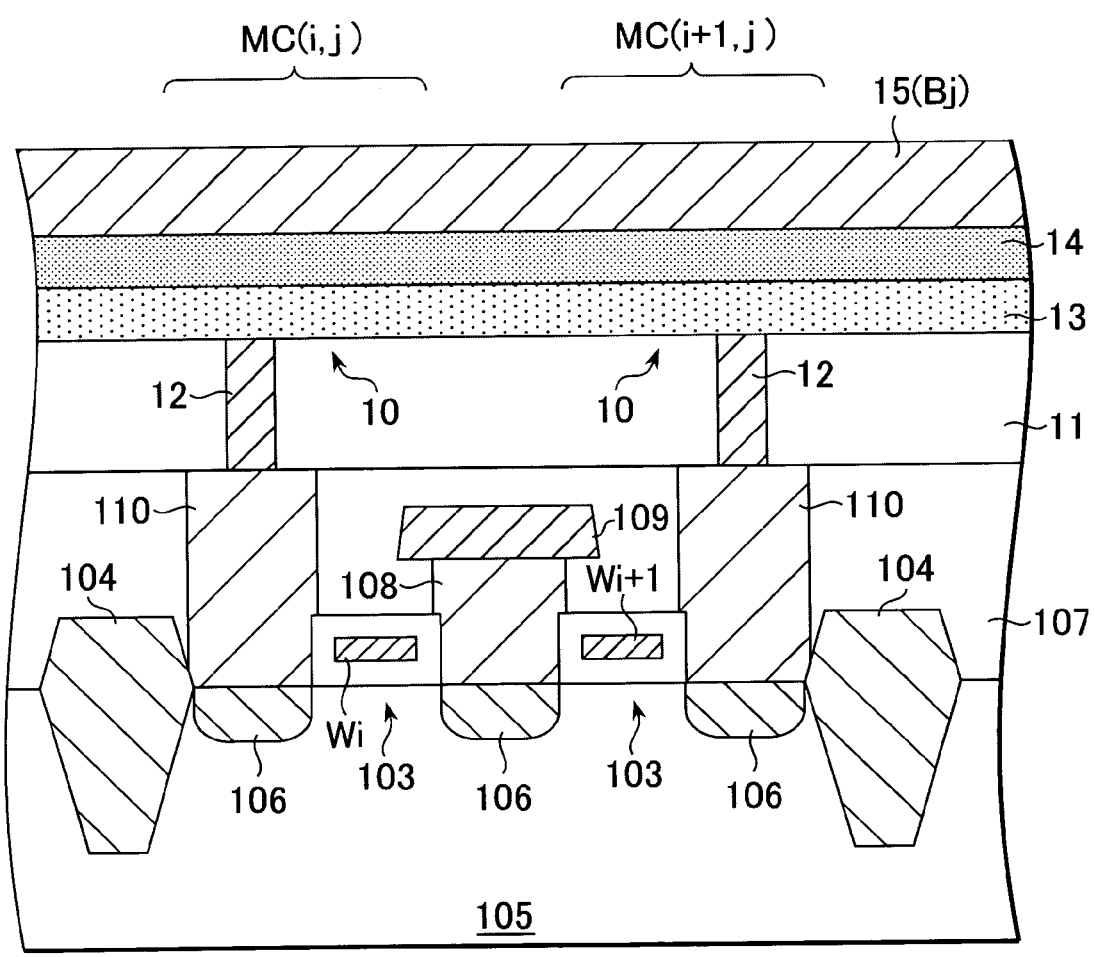
FIG. 5 is a cross-sectional view showing the structure of the memory cells used in the non-volatile memory elements according to a first embodiment of the present invention.

FIG. 5 is a cross-sectional view of an example of a memory cell using the memory element 10. In FIG. 5, two memory cells MC (i, j) and MC (i+1, j) that are connected to the same bit line Bj are shown.

As shown in FIG. 5, word lines Wi and Wi+1 are connected to the gate electrode of the transistor 103. The active region 105, which is defined by element isolation regions 104, comprises three diffusion regions 106, whereby two transistors 103 are formed in a single active region 105. The two transistors 103 share a common source that is connected to the ground line 109 via a contact plug 108 in the interlayer insulation layer 107. The drain of each transistor 103 is connected to the bottom electrode 12 of the corresponding memory element 10 via a contact plug 110.

The two non-volatile memory elements 10 share a common top electrode 15 which can therefore, as shown in FIG. 5, be formed as a continuous electrode. In this embodiment, the memory elements 10 also share a common recording layer 13 and block layer 14.

In the non-volatile semiconductor memory device thus constituted, data reads and writes can be carried out by using the row decoder 101 to activate one of the word lines W1 to Wn, and then passing a current through at least one of the bit lines B1 to Bm. That is, the transistors 103 are switched on in the memory cells of the activated word line, connecting the corresponding bit lines to ground via the memory element 10. In this state, phase changes can be effected in the recording layer 13 by passing write current through the bit lines selected by the column decoder 102.

Specifically, when a prescribed amount of current is used to raise the temperature of the phase change material of the recording layer 13 to at least the melting temperature Tm, shown in FIG. 2, and the current is then abruptly switched off, the rapid cooling that ensues quenches switches the material into the amorphous phase. When an amount of current that is less than the prescribed amount is used to heat the phase change material of the recording layer 13 to a temperature that is at least as high as the crystallization temperature Tx shown in FIG. 2 but lower than the melting temperature Tm, and the current is then gradually reduced, the gradual cooling thus produced promotes crystal growth, switching the material to the crystalline phase. Alternatively, after crystallization at temperature Tx, the current can be abruptly switched off, resulting in rapid quench, and also resulting in the material being in the crystalline phase.

Data can be read by using the row decoder 101 to activate one of the word lines W1 to Wn and then passing a read current through at least one of the bit lines B1 to Bm. A memory cell MC in which the recording layer 13 is in the amorphous phase has a high resistance and a memory cell MC in which the recording layer 13 is in the crystalline phase has a low resistance, so the phase state of the recording layer 13 can be known by using a sense amplifier (not shown) to detect this.

Phase states of the recording layer 13 can be associated with stored logical values. If an amorphous phase state is defined as "0" and a crystalline phase state as "1", for example, one binary bit of information can be stored in a single memory cell. Also, when moving from the amorphous phase to the crystalline phase, the crystallization ratio can be controlled in multiple levels or linearly by adjusting the time the recording layer 13 is held at a temperature that is not lower than the crystallization temperature Tx and lower than the melting temperature Tm. With multilevel control of the ratio between the amorphous phase and the crystalline phase, two or more bits of data can be stored in a single memory cell, while with linear control, information can be stored as analog data.

The method of manufacturing the non-volatile memory element 10 will now be described.

With reference to FIG. 1, to begin with, the interlayer insulation layer 11 is formed, and the through-hole 11a is formed in the interlayer insulation layer 11. The insulation layer 11 may be formed by chemical vapor deposition (CVD), and the through-hole 11a may be formed by photolithography and dry etching.

Next, the bottom electrode 12 is formed on the interlayer insulation layer 11, completely filling the through-hole 11a, and the bottom electrode 12 is then polished until the upper surface of the interlayer insulation layer 11 is exposed; preferably, this is done using chemical mechanical polishing (CMP). In this way, the bottom electrode 12 is buried in the through-hole 11a. It is preferable to use a method that provides good step coverage, such as CVD, to form the bottom electrode 12, ensuring that the through-hole 11a is completely filled.

Next, the recording layer 13, block layer 14 and top electrode 15 are formed, in that order, on the interlayer isolation layer 11. The recording layer 13 and block layer 14 may be formed by sputtering or CVD, although there is no particular limitation on the formation method to be used. If sputtering in used, the recording layer 13 and block layer 14 can be formed in-situ. That is, the recording layer 13 and block layer 14 can be formed in a continuous, consecutive process by placing the semiconductor wafer in a sputtering apparatus provided with a chalcogenide target, and changing the sputter gas appropriately, forming both films 13 and 14 without breaking vacuum.

Figure 6:
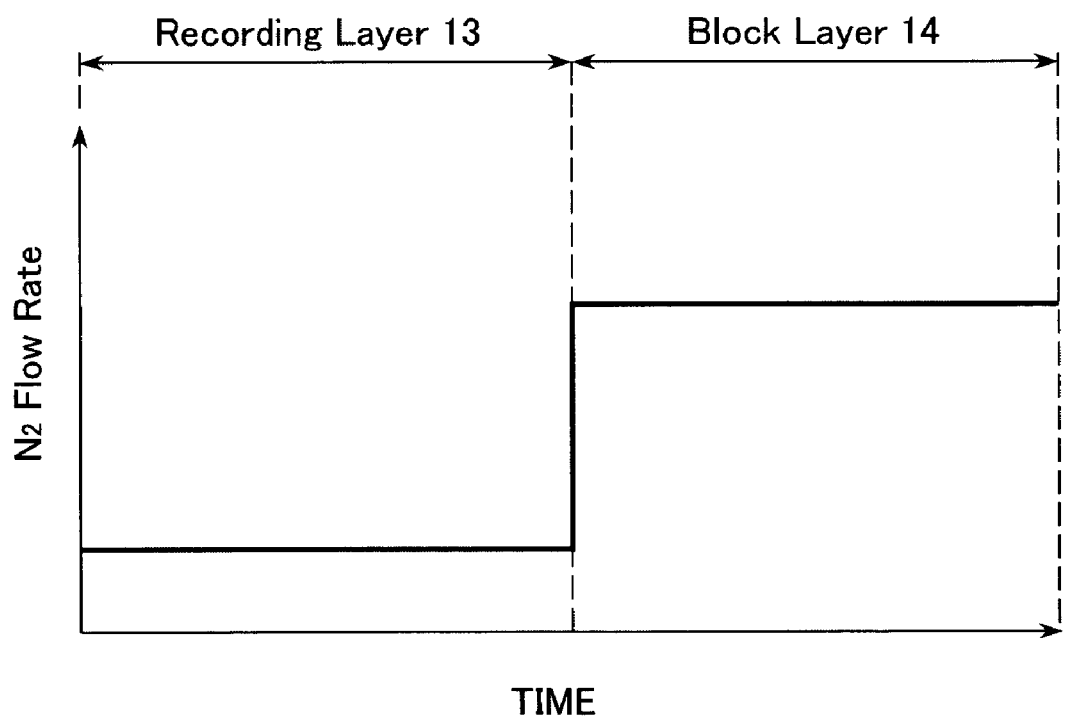
FIG. 6 is a graph showing an example of how the nitrogen gas flow amount is changed when the recording layer and block layer are being formed in a continuous process.

Specifically, as shown in FIG. 6, sputtering can be carried out using a mixture of argon (Ar) gas and a small amount of nitrogen ($N_2$) gas as the first sputter gas, to thereby form on the interlayer isolation layer 11 the recording layer 13 (first phase change material layer) having a composition containing the small amount of nitrogen added to the chalcogenide material constituting the target.

After the recording layer 13 has been formed to the required thickness, the amount of nitrogen in the sputter gas mixture is increased, to then form on the recording layer 13 the block layer 14 (second phase change material layer) having a composition containing the larger amount of nitrogen added to the otherwise similar phase change chalcogenide material. As described with reference to FIGS. 3A and 3B, increasing the amount of nitrogen added to the phase change chalcogenide material raises the electrical resistance and the crystallization temperature, thereby serving to block the phase change action of the recording layer 13.

Figure 7:
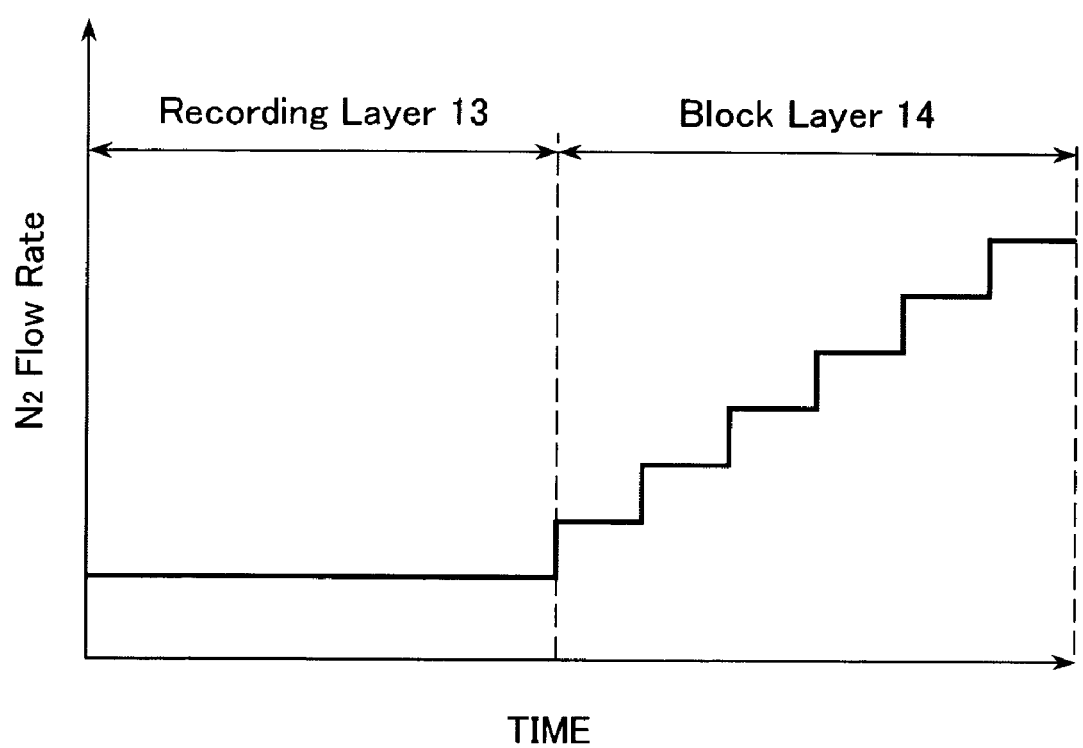
FIG. 7 is a graph showing another example of how the nitrogen gas flow amount is changed when the recording layer and block layer are being formed in a continuous process.
Figure 8:
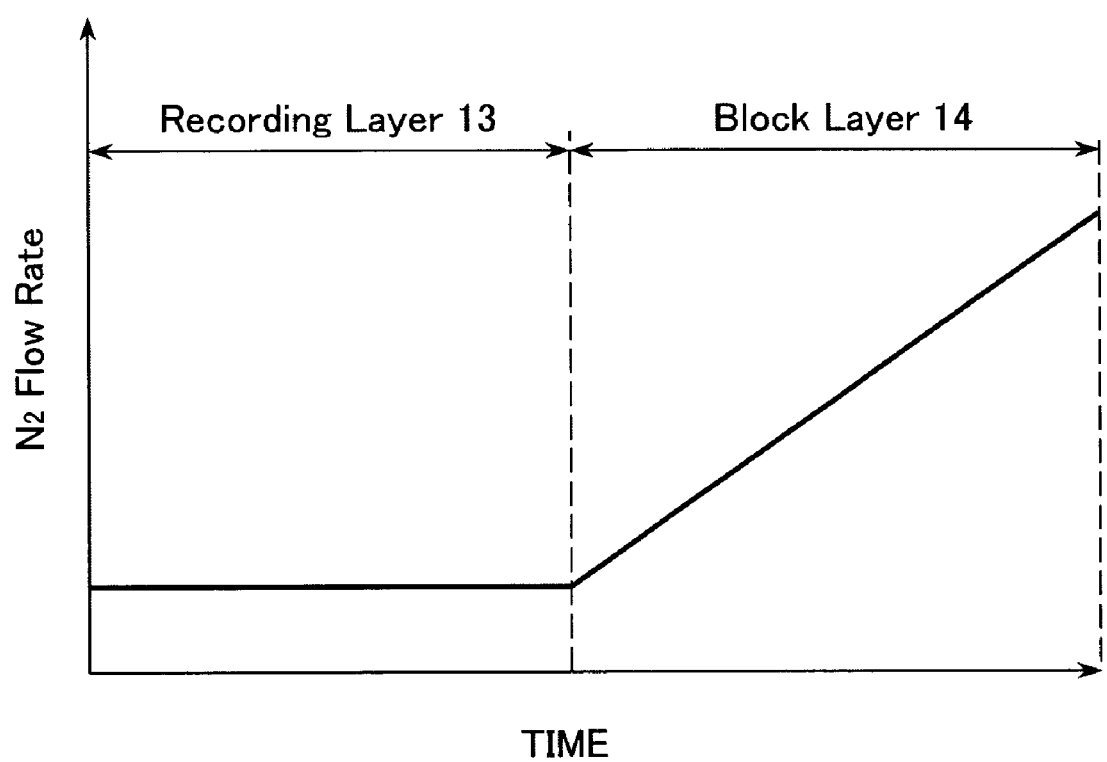
FIG. 8 is a graph showing still another example of how the nitrogen gas flow amount is changed when the recording layer and block layer are being formed in a continuous process.

In the example shown in FIG. 6, the sputter gas composition used during the forming of the block layer 14 stays the same. However, the amount of nitrogen in the sputter gas composition can be increased in stages, as shown in FIG. 7, or steplessly, as shown in FIG. 8, to form a block layer 14 in which the electrical resistance increases in stages or steplessly, going from the recording layer 13 towards the top electrode 15. If the block layer 14 is formed in this way, the recording layer 13 can be made thinner for even higher heating efficiency.

Using such a method in which the recording layer 13 and block layer 14 are formed consecutively in the same apparatus keeps down manufacturing costs and avoids exposure of the films to atmosphere ambient gases. The sputtered chalcogenide film is substantially amorphous immediately after formation, and becomes crystalline when it is heated to or above the crystallization temperature in a subsequent manufacturing process.

Therefore, in one embodiment by constituting the block layer 14 of a phase change material having a crystallization temperature that is higher than the maximum temperature encountered in a subsequent process, the block layer 14 retains its amorphous state through to the completion of the memory element 10. As described, phase change material in the amorphous phase has a high resistance, so that after being formed the block layer 14 can be kept in a state of high resistance by carrying out the remaining steps of the manufacturing procedure at a temperature below its crystallization temperature.

It is not essential for the recording layer 13 and block layer 14 to be formed in a continuous process by changing the sputter gas used. Instead, each of the layers can be formed in a different apparatus. Even when a single apparatus is used, the recording layer 13 and block layer 14 can be formed continuously by changing the targets used rather than the sputter gas.

After the recording layer 13 and block layer 14 have been formed, the top electrode 15 is formed on the block layer 14, and is followed by the prescribed patterning, completing the memory elements 10.

Thus, the memory elements 10 according to this embodiment have a block layer 14 that, with a higher electrical resistance than the recording layer 13, can block the phase changing action of the recording layer 13, thereby suppressing the flow of heat towards the top electrode 15 and greatly limiting the phase change region within the recording layer 13. As a result, high heating efficiency is obtained.

In addition, the top electrode 15 also functions as a bit line, simplifying the overall structure and keeping manufacturing costs down. Also, in one embodiment the block layer 14 is constituted of phase change material, it and the recording layer 13 can be formed in a continuous process in the same film formation apparatus, which further reduces the cost of manufacturing and avoids exposure of either film to atmosphere ambient gases.

Figure 9:
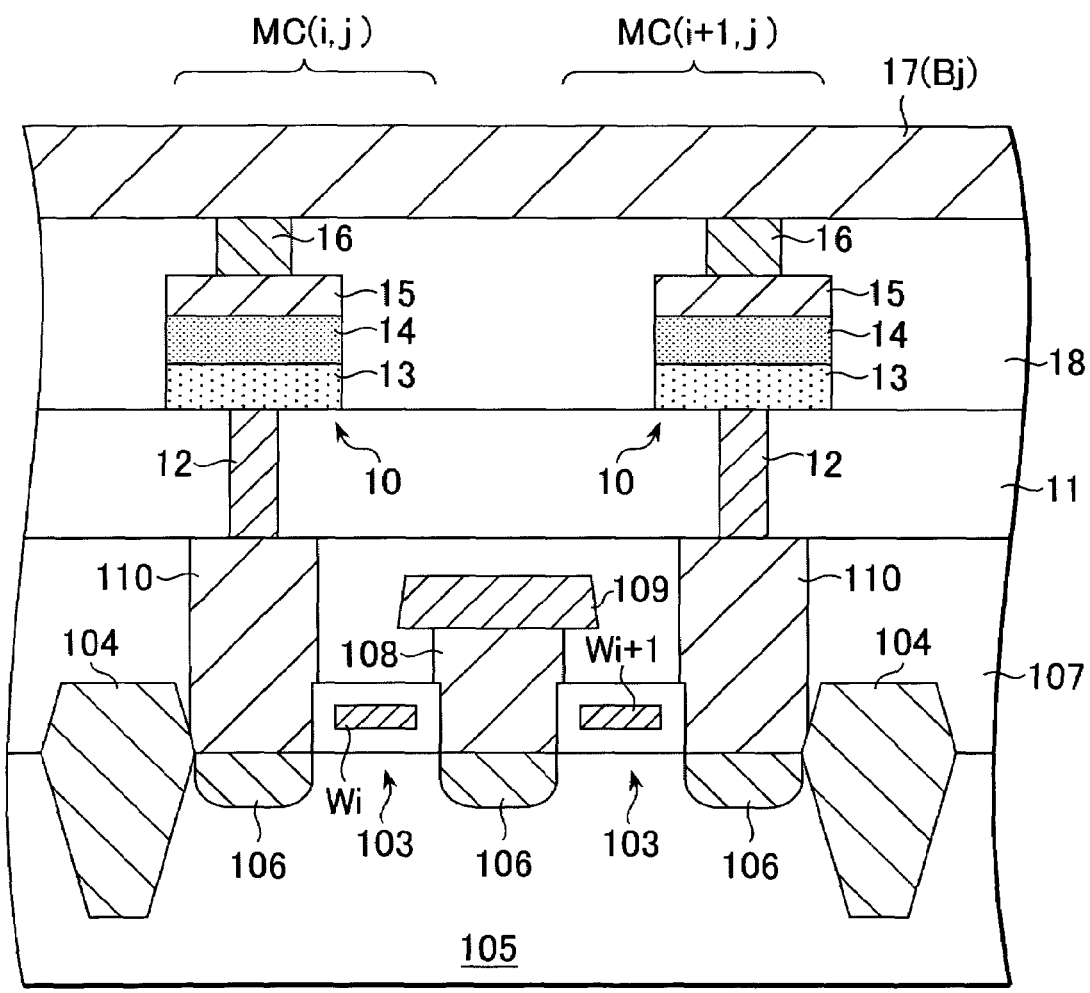
FIG. 9 is a cross-sectional view showing another structure of the memory cells used in the non-volatile memory elements according to a first embodiment of the present invention.

In the example shown in FIG. 5 the recording layer 13, block layer 14 and top electrode 15 are used in common, but can be provided separately for each memory cell, as shown in FIG. 9. In the example of FIG. 9, each memory cell has its own, separate recording layer 13, block layer 14 and top electrode 15, the tops and sides of which are covered by an interlayer isolation layer 18. Here, the top electrodes 15 are each connected to bit line 17 by a contact plug 16.

Using this structure enables the thermal capacity of the top electrode 15 to be further decreased, thereby further reducing heat radiation flow towards the top electrode 15.

Next, a non-volatile memory element 20 according to a second embodiment of the present invention is described.

Figure 10:
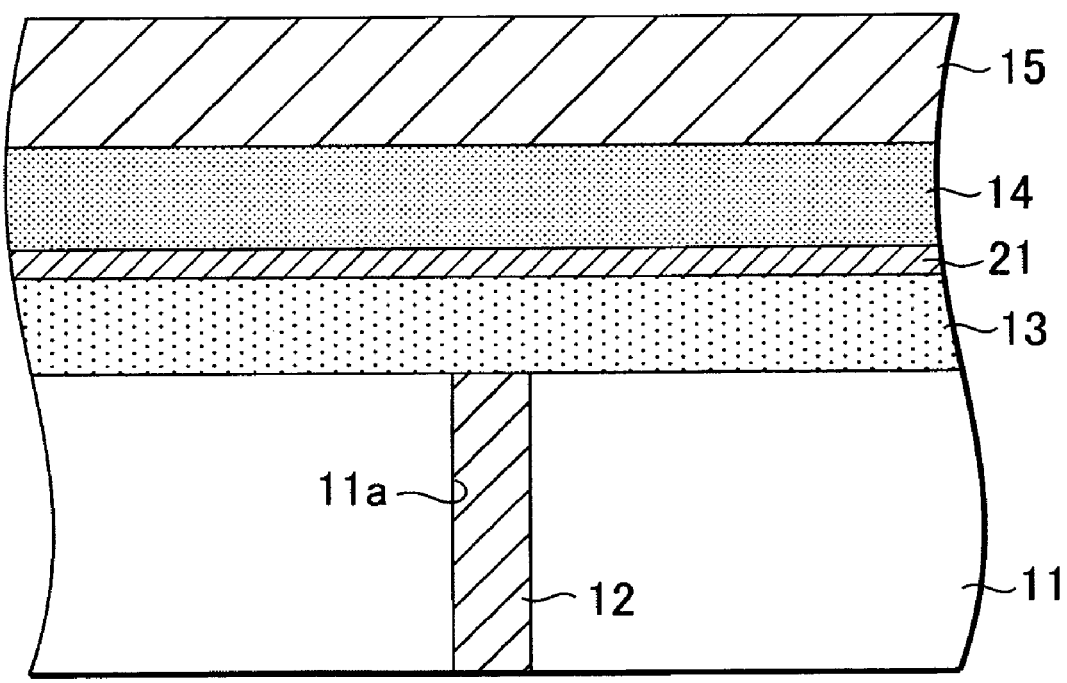
FIG. 10 is a cross-sectional view of the memory element according to a second embodiment of the present invention.

FIG. 10 is a drawing showing the cross-section of the memory element 20 according to the second embodiment of the present invention.

As shown in FIG. 10, the memory element 20 differs from the memory element 10 in having an intermediate layer 21 between the recording layer 13 and the block layer 14. Other parts and elements are the same and are denoted by the same reference numerals, so repeated explanation thereof is omitted.

The intermediate layer 21 serves to prevent intermixing between the recording layer 13 and the block layer 14. There is no particular limitation on the material of the intermediate layer 21, as long as it can prevent the recording layer 13 and block layer 14 from intermixing. However, it is preferable to choose a material having a higher electrical resistance than the recording layer 13. If the electrical resistance of the intermediate layer 21 is lower than that of the recording layer 13, the joule heat that is generated will spread out along the plane of the intermediate layer, and therefore can more readily radiate towards the top electrode 15.

Intermixing between the recording layer 13 and the block layer 14 can be prevented by choosing a material for the intermediate layer 21 that substantially does not intermix with the recording layer 13 or the block layer 14. Materials that satisfy that condition include carbon (C), carbon nitride (CN), titanium aluminum-nitride (TiAlN), and titanium silicon nitride (TiSiN).

This is a suitable method to use when the phase change material constituting the recording layer 13 has a principal component that differs from that of the phase change material constituting the block layer 14. When the principal components differ, it is relatively easy for the phase change materials to mix with each other. Therefore, in such a case, the intermediate layer 21 has to be used to ensure that intermixing between the recording layer 13 and block layer 14 is prevented.

Intermixing of the recording layer 13 and block layer 14 can also be prevented by choosing as the starting material for the intermediate layer 21 the reactant of a material that reacts with at least one of the recording layer 13 and the block layer 14, and substantially does not intermix with the recording layer 13 or block layer 14. Titanium is an example of a starting material that satisfies that condition. If titanium is chosen, it can be used to form titanium-tellurium alloy (TiTe) by reacting with tellurium (Te) contained in the phase change material. Titanium-tellurium alloy will not mix with the phase change material, making it suitable to use as the intermediate layer 21.

This is a suitable method to use when the phase change material constituting the recording layer 13 has a principal component that is the same as that of a phase change material constituting the block layer 14, and the added impurity amounts are different. When the same principal components are used, it is relatively hard for the phase change materials to mix with each other, and using an intermediate layer 21 formed of the above-described reactant ensures that intermixing between the recording layer 13 and block layer 14 does not take place.

Providing an intermediate layer 21 between the recording layer 13 and block layer 14, as in this embodiment, ensures that heat applied during the manufacturing process, or heat generated by the application of a write current, does not result in intermixing taking place between the recording layer 13 and block layer 14. This increases the range of materials that can be used for the recording layer 13 and block layer 14, and also provides higher reliability.

In this embodiment, preferably the recording layer 13, intermediate layer 21 and block layer 14 are formed in a continuous in-situ process in the same film formation apparatus.

The present invention is in no way limited to the aforementioned embodiments, but rather various modifications are possible within the scope of the invention as recited in the claims, and naturally these modifications are included within the scope of the invention.

For example, while in the foregoing embodiments nitrogen is added to the phase change material of the recording layer 13 to increase the electrical resistance, adding nitrogen to the recording layer 13 is not an essential requirement. Hence, when the recording layer 13 is formed by sputtering, the sputter gas can be just argon (Ar).

Also, while in the foregoing embodiments the recording layer 13 is formed directly on the interlayer isolation layer 11, a contact layer of titanium or the like may be provided therebetween to improve contact between the two layers. A contact layer may also be provided between the block layer 14 and the top electrode 15.

What is claimed is:

1. A non-volatile memory element comprising:
   a bottom electrode;
   a top electrode;
   a recording layer formed on the bottom electrode, the recording layer making a phase change between an amorphous phase state and a crystalline phase state to represent high resistance in the amorphous phase state and low resistance in the crystalline phase state; and
   a block layer provided between the recording layer and the top electrode,
   wherein the block layer is constituted of a second phase change material having an electrical resistance that is higher than that of a first phase change material constituting the recording layer so that the block layer makes substantially no change in phase irrespective of occurrence of the phase change of the recoding layer between the amorphous phase state and the crystalline phase state.

2. The non-volatile memory element as claimed in claim 1, wherein the block layer is constituted of phase change material having a composition that differs from that of phase change material constituting the recording layer.

3. The non-volatile memory element as claimed in claim 2, wherein the phase change material constituting the block layer has a crystallization temperature that is higher than a crystallization temperature of phase change material constituting the recording layer.

4. The non-volatile memory element as claimed in claim 3, wherein the phase change material constituting the block layer is in an amorphous state.

5. The non-volatile memory element as claimed in claim 2, wherein the block layer is constituted of phase change material having a principal component that is identical to that of the phase change material constituting the recording layer but with a different amount of added impurity.

6. The non-volatile memory element as claimed in claim 2, wherein the block layer is constituted of phase change material having a principal component that differs from that of phase change material constituting the recording layer.

7. The non-volatile memory element as claimed in claim 1, wherein the electrical resistance of the block layer increases steplessly or in stages, going from the recording layer side to the top electrode side.

8. The non-volatile memory element as claimed in claim 1, wherein the block layer and the top electrode are in contact.

9. The non-volatile memory element as claimed in claim 1, wherein the recording layer and the block layer are in contact.

10. The non-volatile memory element as claimed in claim 1, wherein the top electrode functions as a bit line.

11. The non-volatile memory element as claimed in claim 1, further comprising a bit line connected to the top electrode.

12. The non-volatile memory element as claimed in claim 1, wherein the block layer and the recording layer include nitrogen impurity.

13. A non-volatile memory element comprising:
    a bottom electrode;
    a top electrode;
    a first and a second phase change material layers provided in that order between the bottom electrode and the top electrode, wherein
    the first phase change material layer is formed on the bottom electrode and is configured to make a phase change between an amorphous phase state and a crystalline phase state to represent high resistance in the amorphous phase state and low resistance in the crystalline phase state,
    the second phase change material layer is provided between the first phase change material layer and the top electrode,
    the phase change material constituting the second phase change material layer has an electrical resistance that is higher than that of the phase change material constituting the first phase change material layer so that the second phase change material layer makes substantially no change in phase irrespective of occurrence of the phase change of the first phase change material layer between the amorphous phase state and the crystalline phase state.

14. The non-volatile memory element as claimed in claim 13, wherein the phase change material constituting the second phase change material layer is in an amorphous state.

15. A memory device comprising:
    a plurality of phase change memory elements, each of the phase change memory elements comprising a bottom electrode, a first phase change layer, a second phase change layer, and a top electrode, the first phase change layer formed on the bottom electrode and making a phase change between an amorphous phase state and a crystalline phase state to represent high resistance in the amorphous phase state and low resistance in the crystalline phase state, the second phase change layer being between the first phase change layer and the top electrode and constituted of a second phase change material having an electrical resistance that is higher than that of a first phase change material constituting the first phase change layer so that the second phase change layer makes substantially no change in phase irrespective of occurrence of the phase change of the first phase change layer between the amorphous phase state and the crystalline phase state; and
    a wiring layer interconnecting the top electrodes of the phase change memory elements to one another.

16. The device as claimed in claim 15, wherein the top electrodes of the phase change memory elements are extended continuously to be in contact with one another to thereby serve as at least a part of the wiring layer, the first phase change layers of the phase change memory elements being extended continuously to be in contact with one another, and the second phase change layers of the phase change memory elements are extended continuously to be in contact with one another.

17. The device as claimed in claim 15, wherein the top electrodes of the phase change memory elements are formed separately from one another, the first phase change layers of the phase change memory elements being formed separately from one another, and the second phase change layers are formed separately from one another.

* * * * *